United States Patent [19]
Shou et al.

[11] Patent Number: 5,751,184
[45] Date of Patent: May 12, 1998

[54] LOW ELECTRICAL POWER CONSUMPTION FILTER CIRCUIT

[75] Inventors: Guoliang Shou; Makoto Yamamoto; Sunao Takatori, all of Tokyo, Japan

[73] Assignees: Yozan Inc., Tokyo; Sharp Kabushiki Kaisha, Osaka, both of Japan

[21] Appl. No.: 732,895

[22] Filed: Oct. 17, 1996

[30] Foreign Application Priority Data

Oct. 19, 1995 [JP] Japan .................... 7-296060

[51] Int. Cl.[6] ................................. H03K 5/00
[52] U.S. Cl. .................. 327/552; 327/555; 327/556; 327/557; 327/558; 327/559; 327/311; 327/561; 333/172; 330/107; 330/294
[58] Field of Search .................... 327/552, 555, 327/556, 557, 558, 559, 561, 311; 333/172, 173; 330/294, 107, 303, 109

[56] References Cited

U.S. PATENT DOCUMENTS 4,057,766  11/1977  Lee .......................... 330/107
5,631,941   5/1997  Shou et al. ................. 327/333

OTHER PUBLICATIONS

Shimada, Kimiaki, "Fundamental Knowledge of Analog Filter and Practical Designing Method", p. 27, Fig. 3–11(b), Seibundo–Shinkosha, 1993 (Title and notes of figure translated by applicant) No Month.

*Primary Examiner*—Timothy P. Callahan
*Assistant Examiner*—Dinh T. Le
*Attorney, Agent, or Firm*—Cushman, Darby & Cushman IP Group of Pillsbury, Madison & Sutro LLP

[57] ABSTRACT

A low electric power consumption filter circuit includes an amplifying portion including an odd number of serial MOS inverters. A grounded capacitance is connected between an output of the amplifying portion and ground. A pair of balancing resistances connect an output of the MOS inverter to a supply voltage and ground at a previous stage of the last MOS inverter. A feedback impedance connects an output of the amplifying portion to its input. An input impedance is connected to the input of the amplifying portion.

8 Claims, 3 Drawing Sheets

5,751,184

LOW ELECTRICAL POWER CONSUMPTION FILTER CIRCUIT

FIELD OF THE INVENTION

The present invention relates to a filter circuit.

BACKGROUND OF THE INVENTION

Conventionally, an active filter is known, to include an operational amplifier to which an input impedance is connected. Generally, the operational amplifier is a device of current driven type using a differential amplifier, and its electric power consumption is large.

SUMMARY OF THE INVENTION

The present invention solves the above conventional problems and has an object to provide a filter circuit of low electric power consumption.

A filter circuit according to the present invention includes:

i) an amplifying portion including of an odd number of serial MOS inverters;

ii) a grounded capacitance being connected between an output of the amplifying portion and the ground;

iii) a pair of balancing resistances for connecting an output of the MOS inverter to a supply voltage and the ground at a previous stage of the last MOS inverter;

iv) a feedback impedance for connecting an output of the amplifying portion to its input; and v) an input impedance connected to the input of the amplifying portion.

A desired transfer function is obtained.

Since the filter circuit of the present invention has an amplifying portion consisting of serial MOS inverters, an amplification driven by voltage is performed and electric power consumption can be reduced.

PREFERRED EMBODIMENT OF THE PRESENT INVENTION

Hereinafter, the first embodiment of a filter circuit according to the present invention is described with reference to the attached drawings.

Figure 1:
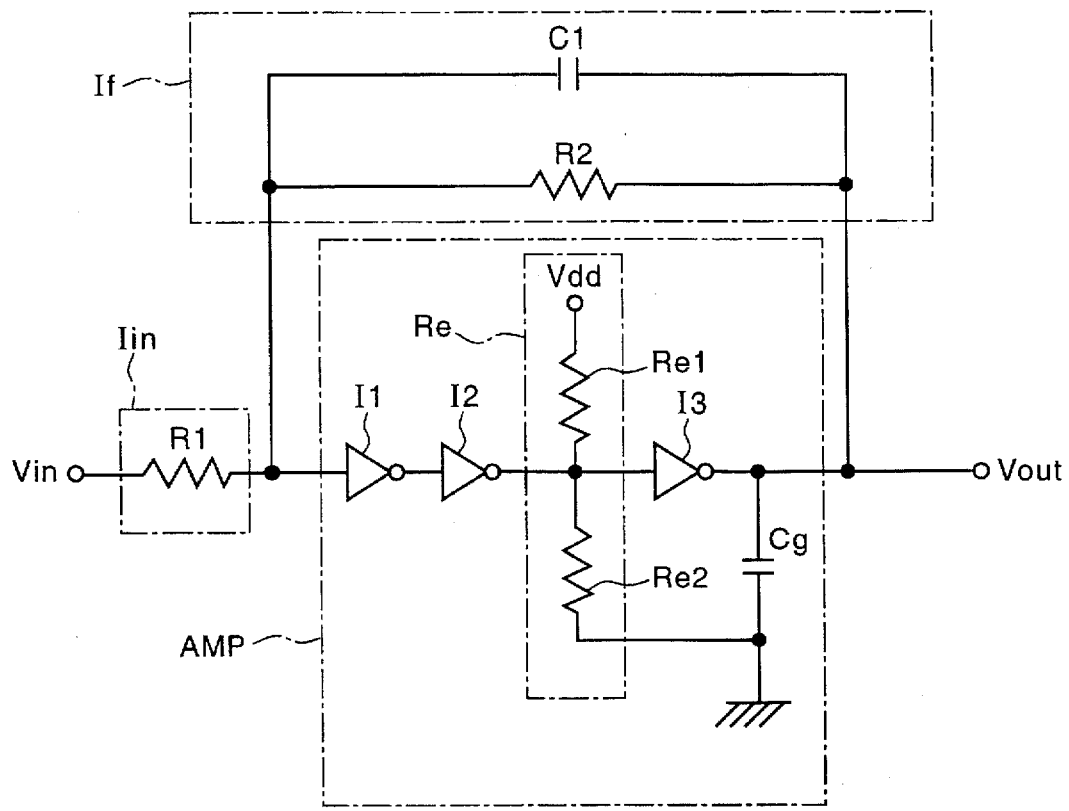
FIG. 1 shows the first embodiment of a filter circuit according to the present invention.

In FIG. 1, a filter circuit includes an input impedance Iin connected to an input voltage Vin and an amplifying portion AMP connected to an output of the input impedance. An output of the amplifying portion AMP is connected to its input through a feedback impedance If.

Figure 2:
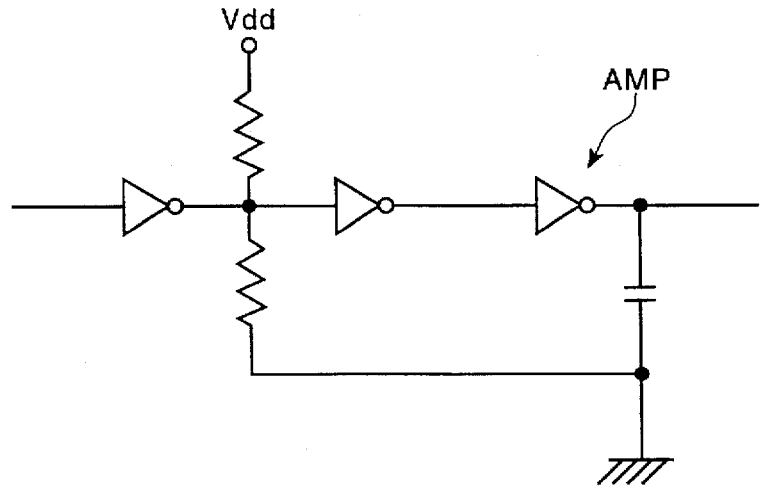
FIG. 2 shows the second embodiment of a filter circuit according to the present invention.

In the amplifying portion AMP, a grounded capacitance for preventing unnecessary oscillation Cg and a balancing resistance Re are connected to three stages of serial MOS inverters I1, I2 and I3. An output of the last stage MOS inverter I3 is connected to the ground through the grounded capacitance Cg which functions as a low-pass filter. The balancing resistance Re is connected to an output of the second inverter I2, which includes of the first resistance Re1 for connecting the output to a supply voltage Vdd and the second resistance Re2 for connecting the output to the ground. As shown in FIG. 2, similar effect can be obtained by the structure that the balancing resistance Re is connected to the output of I1 of the first inverter. In a LSI of 0.8μ rule, a good result can be obtained with Cg of approximately 20 pF and Re1 and Re2 of approximately 40k Ω.

An input impedance Iin is connected to an input of the amplifying portion AMP, and an input voltage Vin is input to the AMP through Iin. An output of AMP is connected to its input through a feedback impedance If. The characteristic of the filter circuit is determined by the Iin and If.

As the amplifying portion AMP includes of MOS inverters, the electric power consumption is lower than an operational amplifier of a type of differential amplifier, and can largely reduce the electric power consumption than a conventional active filter.

The input impedance Iin is a resistance R1, and the feedback impedance If is a parallel circuit of a capacitance C1 and a resistance R2. In this structure, the transfer function T(s) can be expressed by the formula (1) assuming $j\omega = s$.

$$T(s) = -\frac{R2}{R1} \cdot \frac{\frac{1}{R2C1}}{s + \frac{1}{R2C1}} \quad (1)$$

It means a primary low-pass filter. A cut-off frequency $\omega o$ is expressed in the formula (2).

$$\omega o = \frac{1}{R2C1} \quad (2)$$

Figure 3:
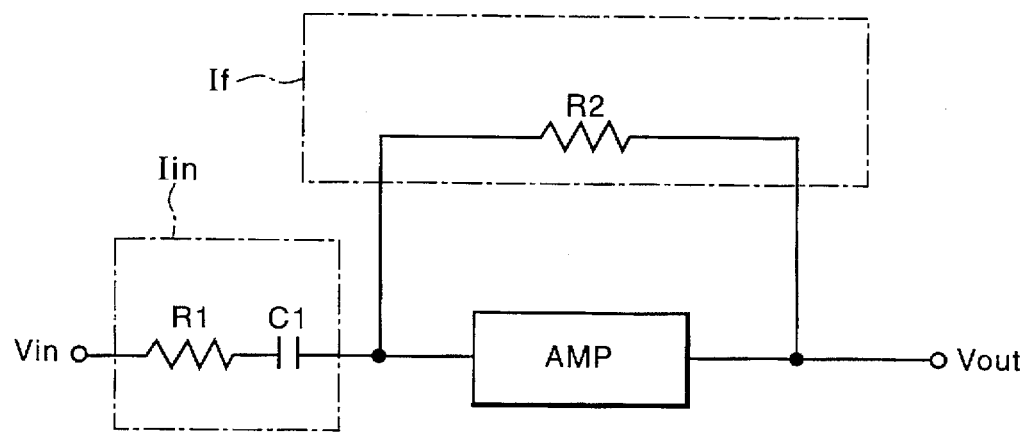
FIG. 3 shows the third embodiment of a filter circuit according to the present invention.

FIG. 3 shows the second embodiment of the present invention. In FIG. 3, only the input impedance Iin and the feedback impedance If are different from the first embodiment. The input impedance Iin is a serial circuit including the resistance R1 and the capacitance C1, and the feedback impedance If is a resistance R2. This circuit is a high-pass filter, and the transfer function T(s) is expressed by the formula (3).

$$T(s) = -\frac{R2}{R1} \cdot \frac{s}{s + \frac{1}{R1C1}} \quad (3)$$

The cut-off frequency is as in formula (4).

$$\omega o = \frac{1}{R1C1} \quad (4)$$

Figure 4:
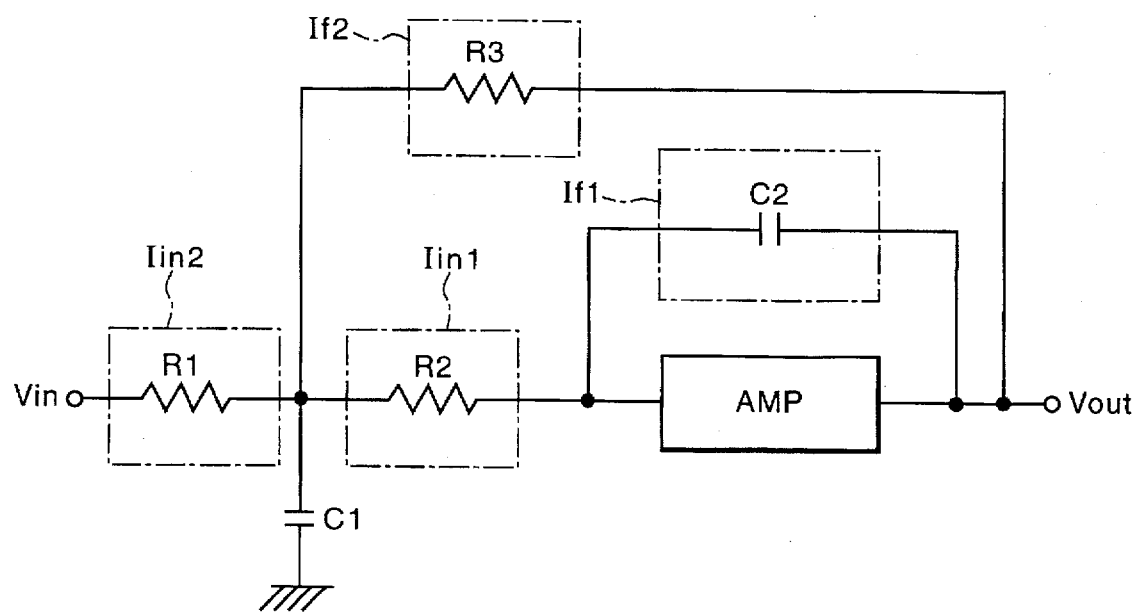
FIG. 4 shows the fourth embodiment of a filter circuit according to the present invention.

FIG. 4 shows the third embodiment with a multi-feedback function. The first input impedance Iin1 is connected to an input of the amplifying portion AMP, and the second input impedance Iin2 is connected to an input of Iin1. The output of the amplifying portion is connected to the input of AMP through the first feedback impedance If1, further it is connected to the input of Iin1 through the second feedback impedance. The juncture of Iin1 and Iin2 is grounded through the capacitance C1.

In the embodiment of FIG. 4, the first input impedance Iin1, the second input impedance Iin2, the first feedback impedance If1 and the second feedback impedance If2 are the resistance R2, the resistance R1, the capacitance C2 and the resistance R3, respectively.

One terminal of the resistance of the second input impedance R1 is connected to an input voltage Vin, and the other terminal is connected to C1 and Iin1. A low-pass filter is formed by R1 and C1.

The circuit of the present embodiment works as a low-pass filter as a whole, and the transfer function is as in the formulas from (5) to (7).

$$T(s) = -\frac{\frac{1}{R1R2C1C2}}{s^2 + \frac{\omega o}{Q} s + \omega o^2} \quad (5)$$

$$\omega o^2 = \frac{1}{R2R3C1C2} \quad (6)$$

$$Q = \frac{\sqrt{\frac{C1}{C2}}}{\sqrt{\frac{R2}{R3}} + \sqrt{\frac{R3}{R2}} + \frac{\sqrt{R2R3}}{R1}} \quad (7)$$

Figure 5:
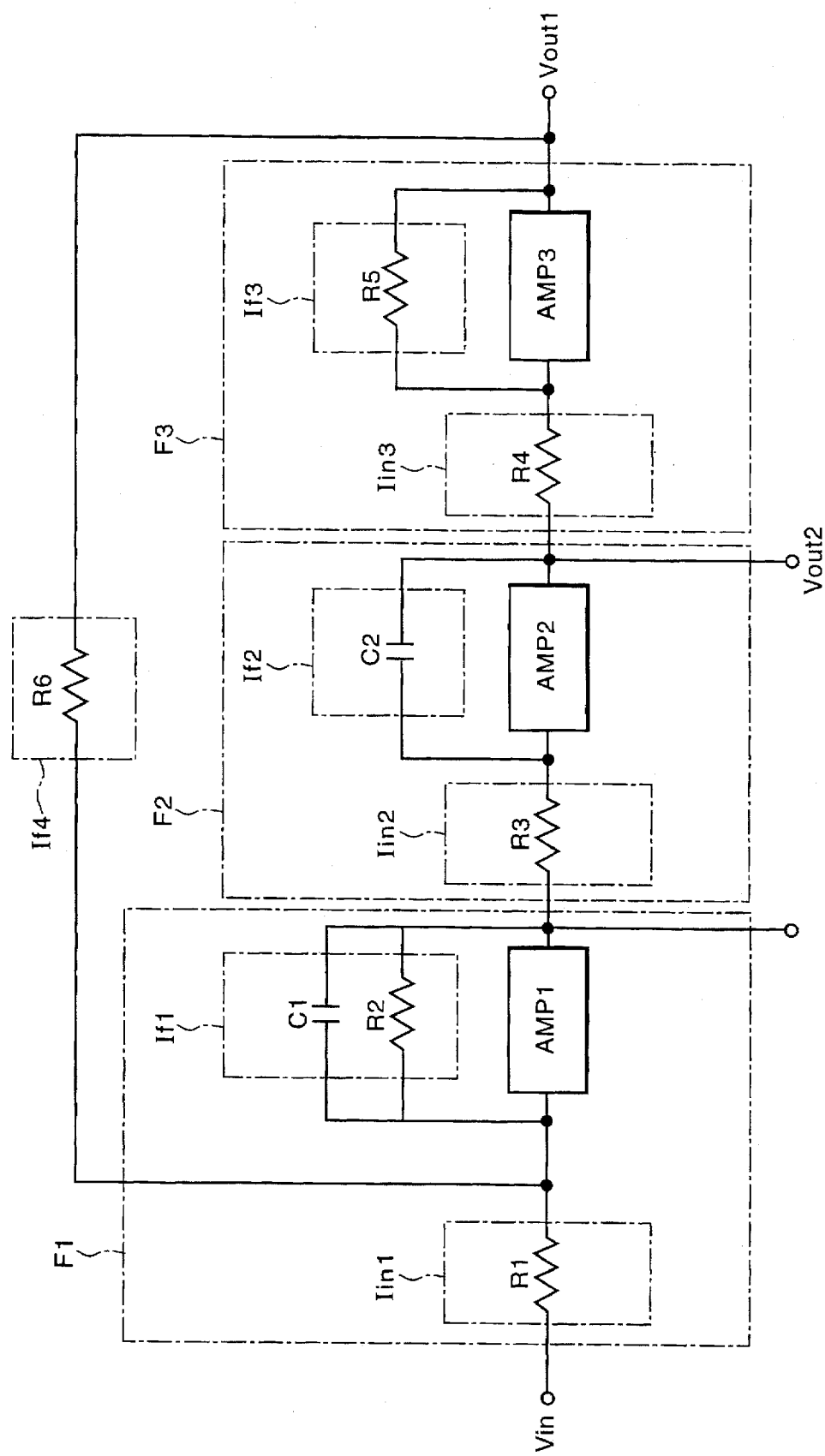
FIG. 5 shows the fifth embodiment of a filter circuit according to the present invention.

FIG. 5 shows the fifth embodiment of the present invention. In the embodiment, so-called biquad circuit is constructed.

In the present embodiment, filter circuits F1, F2 and F3 similar to the embodiments above are serially connected, and an output of the last stage filter circuit F3 is connected to an input of the AMP1 of the amplifying portion of F1.

The filter circuit F1 includes the amplifying portion AMP1, an input impedance Iin1 and a feedback impedance If1. Iin1 includes a resistance R1, and If1 is a parallel circuit of the capacitance C1 and the resistance R2.

The filter circuit F2 includes an amplifying circuit AMP2, an input impedance Iin2 and a feedback impedance If2. The Iin2 is a resistance R3, and If2 is a capacitance C2.

The filter circuit F3 includes an amplifying circuit AMP3, an input impedance Iin3 and a feedback impedance If3. The Iin3 is a resistance R4, and If3 is a resistance R5.

An output of the filter circuit F3 is connected to the input of the amplifying portion AMP1 through the feedback impedance If4. The If4 is a resistance R6.

The filter circuit above generates outputs of Vout1 and Vout2 from F3 and F2, respectively, and has a characteristic of a low-pass filter. The transfer functions are as below. With respect to Vout2, $$T(s) = \frac{\frac{1}{C1C2R1R3}}{s^2 + \frac{1}{C1R2} s + \frac{R5}{C1C2R3R4R6}} \quad (8)$$

$$\omega o^2 = \frac{R5}{C1C2R3R4R6} \quad (9)$$

$$Q = R2\sqrt{\frac{C1R5}{C2R3R4R6}} \quad (10)$$

With respect to Vout1, $$T(s) = -\frac{\frac{R5}{C1C2R1R3R4}}{s^2 + \frac{1}{C1R2s} + \frac{R5}{C1C2R3R4R6}} \quad (11)$$

In the embodiments above, the amplifying portions are the circuits in which three stages of MOS inverters are serially connected. Any odd number of stages can be adopted. Only one MOS inverter is enough in a filter of low accuracy of an output. Excessive stages of MOS inverters cause an unstable oscillation, also, a grounded capacitance and a balancing resistance become large.

As mentioned above, the filter circuit according to the present invention obtains a predetermined transfer function by a filter circuit according to the present invention obtains a predetermined transfer function by:

i) an amplifying portion including of an odd number of serial MOS inverters;

ii) a grounded capacitance connected between an output of the amplifying portion and the ground;

iii) a pair of balancing resistances for connecting an output of the MOS inverter to a supply voltage and the ground at a previous stage of the last MOS inverter;

iv) a feedback impedance for connecting an output of the amplifying portion to its input; and v) an input impedance connected to the input of the amplifying portion.

Therefore, an voltage-driven amplification is performed and electric power consumption can be reduced.

What is claimed is:

1. A filter circuit comprising:

i) an amplifying portion including an odd number of serial MOS inverters;

ii) a grounded capacitance being connected between an output portion of said amplifying portion and the ground;

iii) balancing resistances including a pair of resistances connecting an input portion of a last MOS inverter of said MOS inverters to a supply voltage and the ground;

iv) a first feedback impedance connecting said output portion of said amplifying portion to its input portion; and v) a first input impedance being connected to said input portion of said amplifying portion for receiving an input signal.

2. A filter circuit as claimed in claim 1, wherein said input impedance is a first resistance and said first feedback impedance includes a second resistance and capacitance being parallelly connected between said input portion and said output portion of said amplifying portion.

3. A filter circuit as claimed in claim 1, wherein said input impedance is a serial circuit of a first resistance and a capacitance, and said first feedback impedance is a second resistance.

4. A filter circuit as claimed in claim 1, wherein a second input impedance is connected to an input portion of said first input impedance, and a second feedback impedance is provided for connecting said output portion of said amplifying portion to said input portion of said first input impedance.

5. A filter circuit as claimed in claim 1, wherein said amplifying portion comprises three stages of MOS inverters.

6. A filter circuit comprising:

filter stages being serially connected, each of said filter stages comprising:

i) an amplifying portion including an odd number of serial MOS inverters, ii) a grounded capacitance connected between an output portion of said amplifying portion and the ground, iii) said balancing resistances including a pair of resistances connecting an input portion of a last MOS inverter of said MOS inverters to a supply voltage and the ground, iv) a feedback impedance connecting said output portion of said amplifying portion to its input portion, and v) an input impedance connected to said input portion of said amplifying portion; and a filter circuit feedback impedance connecting an output portion of the last filter stage to an input portion of an amplifying portion of the first filter stage.

7. A filter circuit as claimed in claim 6, wherein number of said filter portions is three.

8. A filter circuit as claimed in claim 6, wherein said feedback impedance of the first filter stage is a parallel circuit of a first resistance and a first capacitance, said input impedance thereof is a second resistance, said feedback impedance of the second filter stage is a second capacitance, said feedback impedance and said input impedance of the third filter stage are third and fourth resistances, and said filter feedback impedance is a fifth resistance.

* * * * *